United States Patent [19]
Schmidt et al.

[11] Patent Number: 5,116,342
[45] Date of Patent: May 26, 1992

[54] TRIGGER CIRCUIT WITH SELF-ADJUSTING REFERENCE VALUE

[75] Inventors: Wolfgang Schmidt, Vaihingen/Enz; Werner Fischer, Heimsheim; Johannes Locher, Stuttgart, all of Fed. Rep. of Germany

[73] Assignee: Robert Bosch GmbH, Stuttgart, Fed. Rep. of Germany

[21] Appl. No.: 636,417

[22] Filed: Dec. 31, 1990

[51] Int. Cl.⁵ .......................................... G01M 19/00
[52] U.S. Cl. ................................ 73/119 A; 307/358; 328/115
[58] Field of Search ............ 328/135, 115; 73/119 A; 307/358

[56] References Cited

U.S. PATENT DOCUMENTS
3,225,213  12/1965  Hinrichs et al. .............. 328/135 X
4,866,298   9/1989  Kniss et al. .................... 307/358 X

FOREIGN PATENT DOCUMENTS
2614947  10/1977  Fed. Rep. of Germany .

Primary Examiner—Jerry W. Myracle
Attorney, Agent, or Firm—Walter Ottesen

[57] ABSTRACT

The invention relates to a trigger circuit which compares amplitudes of the signal waveform of a periodic signal to reference values dependent upon the previous signal waveform of this signal. A trigger signal is emitted when the particular reference value is reached. The trigger circuit includes a memory for the particular reference value. The reference value is determined from a portion of the period of the signal to determine a precise triggering point.

10 Claims, 2 Drawing Sheets

TRIGGER CIRCUIT WITH SELF-ADJUSTING REFERENCE VALUE

FIELD OF THE INVENTION

The invention relates to a trigger circuit which compares amplitudes of the signal waveform of a periodic signal to reference values dependent upon the previous signal waveform of this signal. The trigger circuit emits a trigger signal when the particular reference value is reached. The trigger circuit has a memory for the particular reference value.

BACKGROUND OF THE INVENTION

For the optimal operation of an internal combustion engine by means of a control apparatus, it is necessary to detect the particular injection start of the injection valves of the engine. For this purpose, a trigger circuit is used which evaluates the electric signal of a transducer coacting with the particular injection valve.

Triggering takes place by evaluating the amplitude of the signal waveform of the periodic signal emitted by the transducer. The triggering takes place by means of a comparison with a reference value and is utilized as a time point of the injection start. The time point is transmitted to a computer of the control apparatus which compares the detected injection start to a predetermined characteristic field value of the control apparatus with a control taking place via a timing device in such a manner that the injection time point always takes on the optimal value stored in the characteristic field. In this way, the quality of the exhaust gas can be improved and an economical consumption of fuel is obtained.

One problem is that the magnitude and the shape of the signal greatly fluctuate in dependence upon the many engine parameters. Accordingly, the amplitude of the signal changes with the speed of the engine. This applies also to the signal waveform and especially to the signal flanks. It has been determined that the injection start can be determined from the signal with adequate certainty when triggering is always utilized when the signal amplitude of a monitored period of the signal amounts to approximately 20% of the maximum signal amplitude of the previous signal period. This presupposes that a reference value of the previous signal period is available which amounts to approximately 20% of the corresponding maximum signal amplitude. If the signal reaches this reference value in the monitored period, then the trigger signal is emitted and transmitted to the computer of the control apparatus which carries out the comparison with the characteristic value and the control already mentioned. It is a disadvantage here that the signal of the transducer includes bounce pulses under certain circumstances having amplitude peaks which are greater than the amplitude of the actual useful signal and have nothing to do with the wanted injection start. In this way, the result can be falsified.

Published German patent application DE-OS 26 14 947 discloses a switching arrangement for detecting the position of a rotating part. An inductive transducer is provided which emits an alternating voltage for each corresponding rotation of the part. This alternating voltage is rectified and applied to an integrating capacitor. The integrating capacitor is connected to the one input of a comparator. The alternating voltage is further applied to a zener diode via a series resistor and the zener diode is connected to a further input of the comparator. The above-mentioned integration leads to the condition that incoming disturbance pulses contribute to an increase of the threshold voltage of the comparator in correspondence to their voltage-time area and in this way are considered.

SUMMARY OF THE INVENTION

The trigger circuit of the invention affords the advantage that occurring disturbance signals such as bounce pulses are blanked out and thereby are not considered for the determination of the reference value. In this way, it is possible to very precisely determine the injection start (SB) so that an optimal operation of the engine is possible. The invention is however not limited to the application in the area of motor vehicle electronics; instead, the invention can be utilized in other areas. The blanking of disturbance pulses takes place in that the reference value is simply determined from one part of a period of the signal. Accordingly, only the part of the particular period having the purely useful information is evaluated. The other part is not considered.

According to another feature of the invention, only the first half wave of each period of the signal for determining the reference value is used. Preferably only the positive half wave of the signal is utilized. The above-mentioned bounce pulses occur only after a negative half wave has been traversed. The time point wherein the corresponding injection valve reaches its opened condition is disposed in the region of the negative half wave. The bounce pulses lie with respect to time in the region of the injection end.

It is advantageous if the memory is configured as a capacitor. The capacitor voltage then forms the reference value. For example, to determine the above-mentioned 20%-value of the peak amplitude of the previous signal period, a reference value is utilized which is proportional to the mentioned peak value of the first half wave; that is, the reference value amounts preferably to 20% of the maximum amplitude of this half wave preferably by utilizing a voltage divider.

According to a preferred embodiment, a first comparator is provided which emits an output signal with the first change in sign of the signal resulting within a period which output signal stops a charging of the capacitor caused by the signal. The sign change, which follows the first positive half wave and therefore lies between this half wave and the next negative half wave, is detected and is applied for stopping the charging of the capacitor so that subsequent signal components such as disturbance pulses and/or bounce pulses are not considered. With respect to the sign change, the premise is taken of a fictitious zero line which does not have to lie on the potential "zero volts". For example, it is possible that the zero line is at the level of 4.9 volts.

According to another embodiment, a diode is connected in series with the capacitor with the diode being controllable with respect to its blocking condition by the first comparator. If the above-mentioned sign change of the signal occurs, then the first comparator switches and thereby blocks the diode so that the charging of the capacitor is stopped.

It is advantageous if the first comparator has a monostable function with the switchback into its start condition taking place only when the signal in the particular period has decayed. In this way, it is assured that in each period of the signal, the occurring disturbance pulses and/or bounce pulses are reliably blanked out when determining the reference signal.

If signals of the transducer occur which have a very large amplitude because of the operation of the engine and thereafter (for example, by means of an overrun operation) only very small signals are emitted, then at least a partial discharge of the capacitor can be carried out by means of a discharge circuit after triggering. This discharge of the capacitor takes place in a very short time frame and operates to adapt the capacitor voltage (reference value) rapidly to the new situation.

Furthermore, a second comparator can be provided which is utilized for comparing the amplitudes of the signal to the reference values. This comparator then therewith determines the 20%-value of the previous maximum amplitude in the monitored part of the corresponding period of the signal.

The signal can originate from the above-mentioned transducer which is associated with the injection valve of the internal combustion engine. The trigger signal characterizes the injection start of the injection valve.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
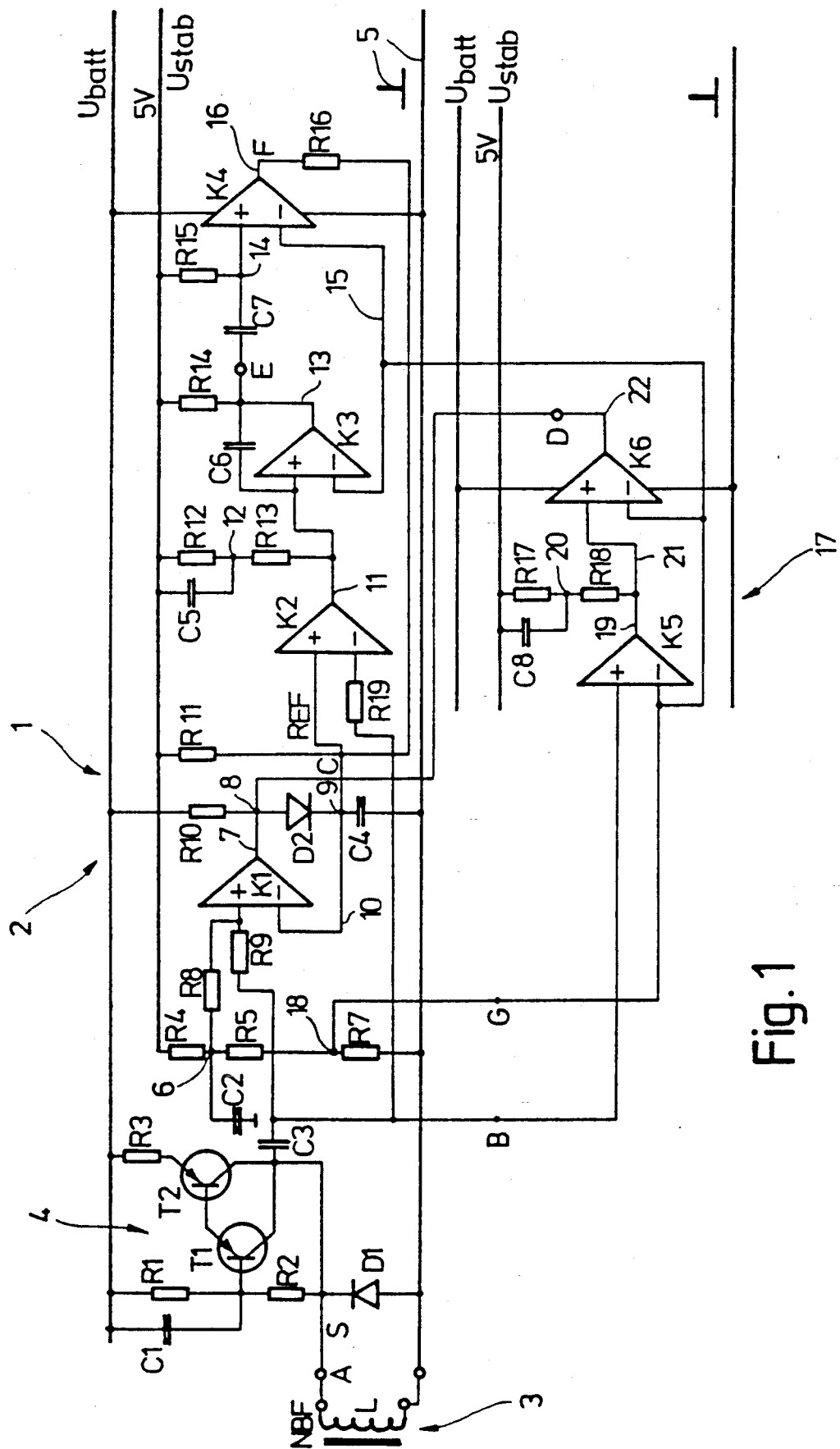
FIG. 1 is a circuit diagram of a trigger circuit.
Figure 2:
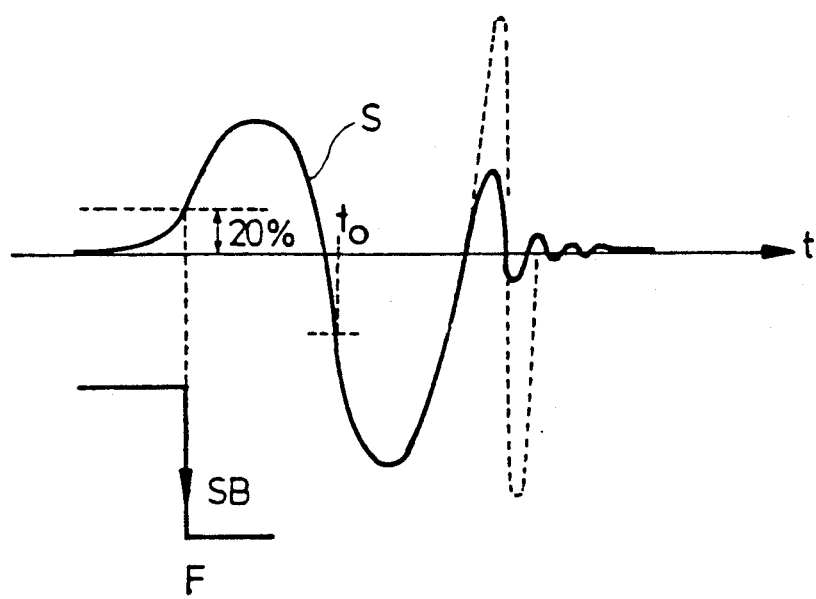
FIG. 2 is a diagram of the signal of a transducer.

FIG. 1 shows a circuit arrangement 1 having a trigger circuit 2. The trigger circuit 2 evaluates a signal S which is supplied by a transducer 3. The transducer 3 is configured as an inductive needle movement sensor NBF. The transducer coacts with an injection valve (not shown) of an internal combustion engine. The engine is configured as a diesel engine and includes a fuel pump which opens the injection valve with each pump stroke whereby the needle movement sensor NBF responds and emits the signal S (FIG. 2).

In the embodiment of FIG. 1, a coil L of the needle movement sensor NBF is supplied by a controlled current source 4. The current source 4 comprises the transistors T1 and T2 and associated circuit components (resistors R1, R2 and R3, capacitor C1). An iron core coacts with the coil L and this core is moved with the actuation of the injection valve and causes an inductive change in the coil L which leads to the formation of the signal S which appears across a terminal A and ground 5. A diode D1 is connected parallel to coil L.

The terminal A is connected to the positive input of a comparator K1 via a capacitor C3 and a resistor R9. In addition, a voltage divider is provided comprising the resistors R4, R5 and R7 with a connecting node 6 being connected to the positive input of the comparator K1 via a resistor R8 and with the connecting node 6 being disposed between the resistors R4 and R5. The connecting node 6 is connected via a capacitor C2 to ground 5. The voltage divider is supplied by a stabilized voltage $U_{stab}$. The stabilized voltage has a magnitude of 5 volts.

A battery voltage $U_{batt}$ is provided which supplies the current source 4 with energy.

The output 7 of the comparator K1 leads to a connecting node 8 which is connected via a resistor R10 to the battery voltage $U_{batt}$. In addition, the anode of a diode D2 is connected to the connecting node 8 and the cathode of the diode D2 is connected to a connecting node 9. A capacitor C4 is connected between the connecting node 9 and ground 5. Furthermore, the negative input of the comparator K1 is connected to connecting node 9 via a line 10. A terminal C is connected to the connecting node 9 and is connected via a resistor R11 to the stabilized voltage $U_{stab}$. The connecting node 9 is also connected to the positive input of a further comparator K2. The negative input of the comparator K2 leads via a resistor R19 to a terminal B which is disposed between the capacitor C3 and the resistor R9.

The output 11 of the comparator K2 is connected to a series circuit of resistors R12 and R13 which leads to the stabilized voltage $U_{stab}$. A connecting node 12 is disposed between the resistors R12 and R13 and leads via a capacitor C5 to the stabilized voltage $U_{stab}$.

In addition, the output 11 of the comparator K2 is connected to the positive input of a comparator K3. This comparator K3 has an output 13 which is connected via a capacitor C6 to the positive input of the comparator K3. The output 13 is also connected to a terminal E and a resistor R14 is connected between the terminal E and the stabilized voltage $U_{stab}$. An RC-component is provided which includes a resistor R15 and a capacitor C7. The capacitor C7 is connected to the terminal E and the resistor R15 is connected to the stabilized voltage $U_{stab}$. A connecting node 14 is disposed between the resistor R15 and the capacitor C7 and is connected to the positive input of a further comparator K4. The negative input of the comparator K3 is connected via a line 15 to the negative input of the comparator K4. The output 16 of the comparator K4 is connected via a resistor R16 to the terminal C.

Finally, a blanking circuit 17 is provided which includes a comparator K5. The negative input of the comparator K5 is connected to a terminal G which is connected to a connecting node 18 disposed between the resistor R5 and the resistor R6 of the voltage divider mentioned above. The positive input of the comparator K5 is connected to terminal B. The output 19 of the comparator K5 is connected to a voltage divider which includes resistors R17 and R18. The resistor R17 is connected to the stabilized voltage $U_{stab}$. A connecting node 20 is disposed between the resistors R17 and R18 and is connected via a capacitor C8 to the stabilized voltage $U_{stab}$.

The output 19 is connected to the positive input of the last comparator K6 via a line 21 and the negative input of the comparator K6 is connected to the negative input of comparator K5. The output 22 of the comparator K6 is connected to a terminal D which leads to the connecting node 8. The comparators K1, K2, K3, K4, K5 and K6 are supplied by the battery voltage $U_{batt}$.

The operation of the switching arrangement 1 will be described in the following.

The signal S is transmitted via the capacitor C3 and via the resistor R19 to the negative input of the comparator K2. This comparator K2 constitutes a primary evaluation comparator. The comparator K2 compares the signal S to a reference value REF at its positive input. The reference value REF is also present at the terminal C and therefore at the capacitor C4. If the signal S at the negative input of the comparator K2 exceeds the reference value REF, then the comparator K3 switches whereby a negative flank F (see FIG. 2) occurs at point E and defines the injection start SB of the above-mentioned injection valve.

The magnitude of the reference value REF is proportional to the peak value of a first half wave of the last period of the signal S. This occurs for the following reasons. The terminal B has (without signal S) a potential which is slightly lower than the stabilized voltage $U_{stab}$. The voltage $U_{stab}$ is 5 volts and the lower potential at point B is preferably 4.9 volts. The capacitor C4 (terminal C) is charged via the very high ohmage resistor R11 to the value of the stabilized voltage $U_{stab}=5$ volts so that the base threshold (reference value REF) is 5 volts. If the signal S contains only very small amplitudes, then the reference value REF at comparator K2 is formed by this base threshold of 5 volts. If a negative flank occurs at terminal E, then injection start is signalled to the computer of the control apparatus.

If larger amplitudes of the signal S occur, for example, because of a higher rotational speed or a higher load on the engine, then these amplitudes are reduced because of the resistors R8 and R9 in such a manner that these amplitudes amount to only 20% of the original amplitudes. The comparator K1, the diode D2 and the resistor R10 conjointly define a rectifying circuit without a threshold value and this circuit charges the capacitor C4 to this 20% value. Since the resistor R11 is of very high ohmage, the potential at C4 (reference value REF) between two periods of the signal S is hardly reduced. For the subsequent period of the signal S, this reference voltage REF is used threshold by the comparator K2. In this way, the maximum amplitude of the last period of the signal S determines the reference value REF in the subsequent period of the signal S.

According to the invention, it is not the entire last period of the signal S which is evaluated for charging the capacitor C4, that is, for providing the reference value REF. Otherwise, it would be necessary to proceed on the premise of too many large amplitude peaks which originate from bounce pulses and therefore would lead to a falsification in the determination of the injection start. In order to avoid this, only a portion of the corresponding period of the signal S is used for determining the reference value REF. This portion is selected in a manner so that it does not contain the mentioned bounce pulses. Preferably, only the first half wave and especially the positive half wave of each period of the signal S is used for the determination of the reference value REF. The blanking of the region of the period containing the disturbances and especially bounce pulses, is performed by the blanking circuit 17.

As mentioned above, the terminal B has a somewhat lower potential than the stabilized voltage $U_{stab}$. The terminal B is at, for example, 4.9 volts. The potential at terminal G is less than at terminal B because of the voltage divider defined by resistors R4, R5 and R7. This potential amounts to, for example, 4.5 volts. The potentials of the terminals B and G are inputted to the inputs of the comparator K5. The potential at the terminal G is applied to the negative input and forms a reference value. As long as no signal S from the needle movement sensor NBF is emitted, the comparator K5 is at "high" potential at its output 19. When the transducer 3 supplies the first positive half wave of the signal S (FIG. 2) and this signal reaches the positive input of comparator K5 via capacitor C2, the output 19 remains at its "high" potential. The comparator K5 switches only when the potential at the positive input of the comparator K5 is less than the potential at the negative input. This means that the first negative half wave (which follows the first positive half wave of the signal S) leads to the condition that the comparator K5 switches and its output 19 thereby assumes the "low" condition. The switching time point of the comparator K5 is identified in FIG. 2 by $t_0$. The "low" potential on the line 21 likewise leads to switching of the comparator K6 whereby the output 22 of the comparator K6 assumes the "low" condition. In this way, a quasi ground potential is applied to the connecting node 8 whereby the diode D2 goes into its blocking condition. This again means that the capacitor K4 cannot be further charged via the diode D2; that is, the reference value, produced by the first half wave of the corresponding period of the signal S at capacitor K4, remains stored with the reference value being 20% of the peak amplitude of this first half wave. Falsifications by subsequent amplitudes which are still greater are avoided since these amplitudes (bounce pulses) cannot be applied to the capacitor C4 because of the blocking of diode D2.

The comparators K5 and K6 and the capacitor C8 and resistor R17 all conjointly define a monostable function which is selected so that the return switching into the initial condition of the comparators K5 and K6 takes place only when the signal S in the particular period monitored has decayed; that is, when the bounce pulses have vanished. The sign change of the signal S at the time point $t_0$ further has the physical meaning that the corresponding injection valve has now taken on its open condition. This information can be taken from the terminal D and processed by the computer of the control apparatus. In this connection, it should be considered that the time line in FIG. 2 must not necessarily correspond to a zero voltage potential line; rather, this line can also be a mean value line which has a positive potential so that "positive" and "negative" half waves can be referred to only in an imaginary sense.

The potential (that is the reference value REF) on the capacitor C4 is reduced only very slowly via the high-ohmage resistor R11. For this reason, several signals S would not be detected at all if first very large signals S and thereafter (for example because of an overrun operation of the engine) suddenly very small signals S would occur. The comparator K4 is switched in order to avoid this problem. Each injection pulse (terminal E) generates a very short difference pulse because of the resistor-capacitor combination (R15, C7) which generates a short negative peak (terminal F) at the output 16 of the comparator K4. This leads to the condition that the capacitor C4 is partially discharged for a very short time after injection start (SB) has been detected. In this way, a dynamic is generated so that even with a transition from very large to very small signals S, the actual 20% amplitude value at capacitor C4 can always be stored. The discharge of the capacitor C4 described above does not occur completely but instead leads to a partial discharge. This discharge must be terminated shortly after the SB-detection of the corresponding period since otherwise this function would collide with the charging function of the resistor R10.

It is understood that the foregoing description is that of the preferred embodiments of the invention and that various changes and modifications may be made thereto without departing from the spirit and scope of the invention as defined in the appended claims.

What is claimed is:

1. A trigger circuit for receiving a signal waveform of a periodic signal, the trigger circuit comprising:
   storage means for storing a particular reference value dependent upon the preceding waveform of said periodic signal;
   circuit means for determining said reference value from only the first half wave of each period of said signal;

comparator means for comparing the amplitudes of said signal waveform of said periodic signal to said reference value and for emitting a trigger signal when said particular reference value is reached;

said storage means being a capacitor which is charged by said signal and which is connected to said comparator means; and, said reference value being proportional to the peak value of said first half wave of said period of said signal.

2. The trigger circuit of claim 1, wherein said signal passes through changes of sign during said period; and, wherein said trigger circuit further comprises a first comparator for emitting an output signal in response to a first change of sign within said period for terminating the charging of said capacitor by said signal.

3. The trigger circuit of claim 2, further comprising an additional comparator connected in cascade with said first comparator and said storage means further including a diode connected in series with said capacitor; and, said first comparator being adapted to control said diode into its blocking state via said additional comparator.

4. The trigger circuit of claim 3, said first comparator having a monostable function and being adapted to switch back into its initial state only when said signal has decayed in said period.

5. The trigger circuit of claim 3, further comprising discharge means for carrying out at least a partial discharge of said capacitor after said trigger signal is emitted.

6. The trigger circuit of claim 5, further comprising a second comparator for comparing the amplitudes of said signal to said reference values.

7. The trigger circuit of claim 6, further comprising a transducer operatively connected to an injection valve of an internal combustion engine; and, said transducer being adapted to emit said signal.

8. The trigger circuit of claim 7, wherein said trigger signal characterizes the injection start of the injection signal.

9. The trigger circuit of claim 8, further comprising means for detecting the switching of said first comparator as the starting time point of the open position of the injection valve.

10. The trigger circuit of claim 6, further comprising a voltage supply and a high-ohmage resistor connected between said voltage supply and said capacitor; said high-ohmage resistor and said capacitor being connected to each other at a circuit node; and, said second comparator being connected to said circuit node for receiving a base threshold.

* * * * *